United States Patent
Keeth et al.

(10) Patent No.: US 6,687,185 B1
(45) Date of Patent: Feb. 3, 2004

(54) METHOD AND APPARATUS FOR SETTING AND COMPENSATING READ LATENCY IN A HIGH SPEED DRAM

(75) Inventors: Brent Keeth, Boise, ID (US); Brian Johnson, Boise, ID (US); Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/230,221

(22) Filed: Aug. 29, 2002

(51) Int. Cl.[7] .................................................. G11C 8/00
(52) U.S. Cl. ..................... 365/233; 365/194; 327/158; 327/156; 327/147
(58) Field of Search ........................... 365/233, 194, 365/189.01, 230.01; 327/158, 156, 147

(56) References Cited

U.S. PATENT DOCUMENTS

2002/0093871 A1 * 7/2002 Kwak .......................... 365/233
2002/0141280 A1 * 10/2002 Hamamoto et al. ......... 365/233
2002/0180500 A1 * 12/2002 Okuda et al. ............... 327/158

* cited by examiner

Primary Examiner—Michael S. Lebentritt
Assistant Examiner—Nam Nguyen
(74) Attorney, Agent, or Firm—Dickstein Shapiro Morin & Oshinsky LLP

(57) ABSTRACT

An apparatus and method for coordinating the variable timing of internal clock signals derived from an external clock signal to ensure that read data and a read clock used to latch the read data arrive at the data latch in synchronism and with a specified read latency. A read clock is produced from the external clock signal in a delay lock loop circuit and a start signal, produced in response to a read command, is passed through a delay circuit slaved with the delay lock loop so that the read clock signal and a delayed start signal are subject to the same internal timing variations. The delayed start signal is used to thereby control the output of read data by the read clock signal.

105 Claims, 4 Drawing Sheets

METHOD AND APPARATUS FOR SETTING AND COMPENSATING READ LATENCY IN A HIGH SPEED DRAM

FIELD OF THE INVENTION

The present invention relates to DRAM circuits and, more specifically to a circuit and method for ensuring that correct data is output from a high speed DRAM with a correct read latency.

BACKGROUND OF THE INVENTION

A typical DRAM memory system has an external DRAM controller which makes read and write requests of a DRAM memory device. When making a read request the controller expects data within the memory device to be available on a data bus with a predetermined read latency which is usually a predetermined number of external system clock cycles after a read request is made by the controller e.g., eight external clock cycles. Internally, the DRAM memory device has its own clock system which receives the external clock signal and develops from the external clock several different internal clock signals for internal operation of the memory device.

The internal clock system of a known high speed memory device produces at least two clock domains. The first clock domain represents tie timing used in the bulk of the logic circuits and to drive the memory array core. The timing for the first domain is produced from a buffered external free running system clock. The phase of the clock signal in the first domain relative to the external clock is dependent upon a clock receiver and clock tree delays. The second domain, also derived from the external system clock, represents the timing of a back-timed read clock. This clock domain is produced by a delay lock loop (DLL). This second clock domain produces a read clock, for operating data read latches. The read clock is provided to the read latch with a desired phase relationship to the external system clock. The second clock domain compensates for delays in the data output (Do) path in order to produce a read clock signal which operates the output data latches to achieve a specified phase alignment with the external system clock. Neither of these two clock domains truly accurately reflects the timing of the external system clock, particularly at high frequencies of operation and the timing of the clock signals in the two domains may criss-cross one another during memory device operation due to process, voltage and temperature (PVT) variations. This may cause a problem in that one clock domain responsible for delivery of read data to an output latch may cause this data to be delivered at a different time from when the back-timed read clock for latching that data is present at the latch.

In order to meet a specified read latency the memory device must be able to count clock signals following receipt of a READ command and activate the output latch to latch output data with the back-timed read clock at the precise time necessary to produce the specified read latency. This is difficult when the first and second clock domains keep criss-crossing each other.

Since the amount of read clock back-timing becomes indeterminate relative to the data availability, it is very difficult to control the read clock and guarantee a correct data output and a specific read latency as measured in external clock cycles.

SUMMARY OF THE INVENTION

The present invention provides a method and apparatus for compensating for uncertainty and variations in the amount of read clock back timing relative to data flow in order to obtain a correct data output at a specified read latency as measured in external clock cycles.

In the invention a start signal is transferred from the external system clock domain to the internal read clock domain so that the start signal has a fixed timing relationship to the read clock. The start signal tracks any changes in the read clock timing and is used to guarantee that read data from a memory array and a read clock are properly synchronized at the output of a memory device.

The start signal is generated by a command decoder upon receipt of a READ command and is passed through a delay line which is slaved to the delay locked loop (DLL) delay line which is used to back-time the read clock. After passing through the slaved delay line the start signal will have the same phase and back-timing relative to the external clock as the read clock.

A counter is pre-loaded with a value provided by a mode register and an offset register. This value represents a desired read latency minus a measured delay in providing a read clock signal through the DLL, clock tree, output latch, and output driver. The counter will count to a specified value using the read clock following receipt of the start signal. The actual count value pre-loaded into the counter may be further offset by one or more counts to allow for decoding or other miscellaneous delays within the memory device. When the counter reaches the specified value it courses the output circuit which receives the read data and read clock to synchronically latch the read data and output the read data with a specified read latency.

Thus, even if the back-timing of the read clock output varies and criss-crosses a clock cycle boundary, the start signal will move with it, keeping the operation of the data and read clock synchronized.

The foregoing and other features and advantages of the invention will become more apparent from the detailed description of the exemplary embodiments of the invention given below in connection with the accompanying drawings.

DETAILED DESCRIPTION OF THE INVENTION

The present invention compensates for uncertainty and variation in the amount of read clock back-timing in a DRAM by delivering data to the output latches which is properly timed to the back timed read clock in order to ensure that proper data is delivered to the data bus with a specified read latency.

Figure 1:
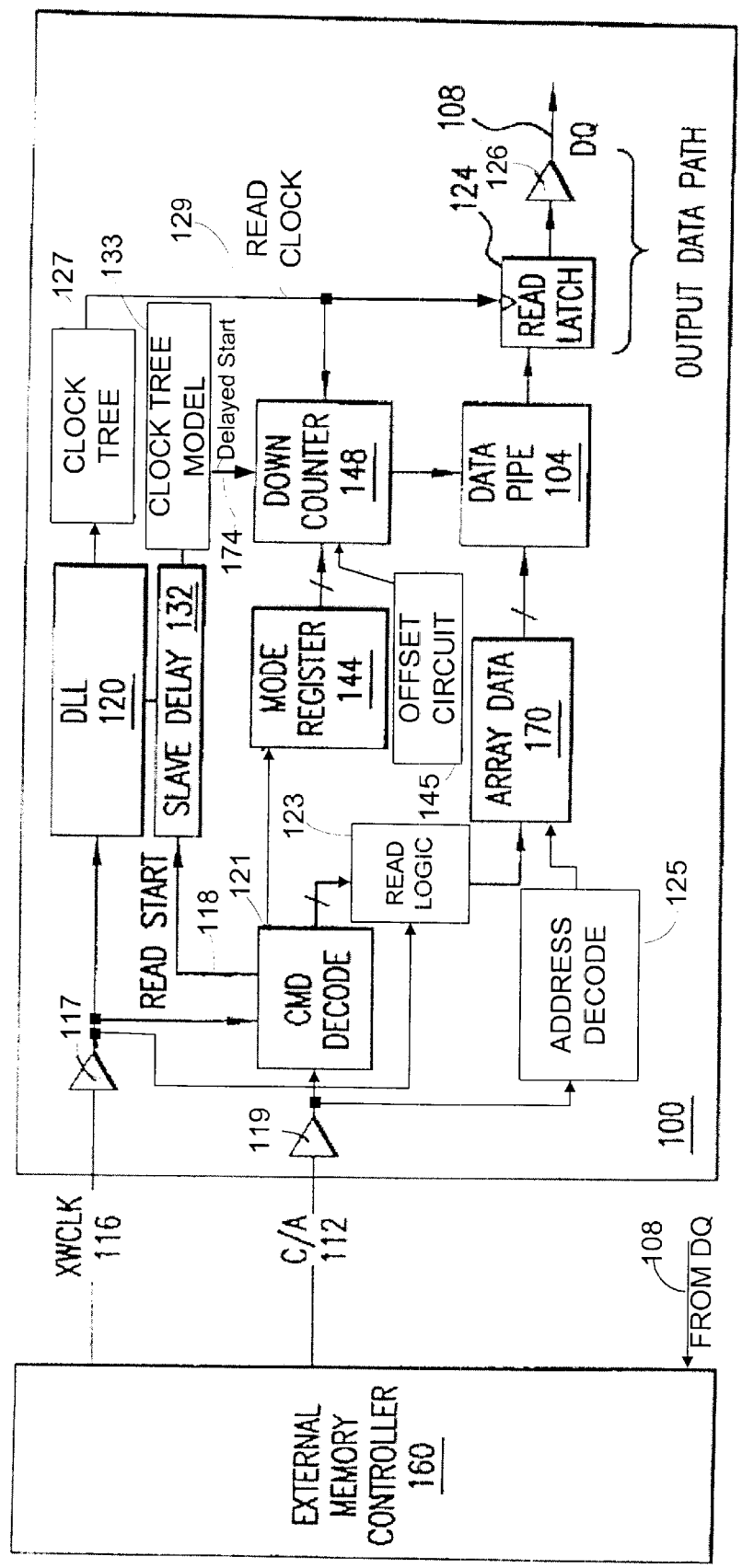
FIG. 1 is a block diagram of a first embodiment of a memory device which employs the present invention.

FIG. 1 illustrates the operative part of a first embodiment of the invention as part of a memory device 100. An external memory controller 160 supplies an external system clock XWCLK to memory device 100 on external clock line 116 and command and address signals on command/address bus 112. Memory array data between the controller 160 and memory device 100 are exchanged over a multi-bit data bus which is represented in FIG. 1 by one data line 108 of the bus. Since the invention is directed particularly at the timing of read operations which occurs within the memory device 100, the data line 108 is shown as delivering selected read data from a memory array 170 through a data pipe 104 to a read latch 124 to a line driver 126 to the line 108 and into memory controller 160. The data pipe 104 includes a serializer for converting array data delivered in parallel to serial data for delivery to DQ path 108.

The memory device 100 further includes a clock buffer 117 for buffering the external system clock XWCLK, a command/address buffer 119 for buffering command and address signals appearing on command and address bus 112, and a command (CMD) decoder 121 for decoding incoming commands from the memory controller 160. A decoded READ command decoded by the decoder 121 is utilized to initiate a read operation on the memory array 170 and initiates a read operation through the control logic of the memory device 100 which is depicted in FIG. 1 as the read logic 123 which operates the memory array 170 to read out data from one or more memory addresses as specified by the controller 160 which are decoded by address decoder 125. The read logic is driven by a buffered external system clock signal XWCLK.

The buffered external clock is also applied to the command (CMD) decoder and address decoder to appropriately read in command and address data from memory controller 160. The buffered external clock is also applied to a delay lock loop 120, which in combination with clock tree 127, produces additional internal clocking signals for the memory device 100, one of which is the read clock signal on line 129. As discussed above, the read clock produced by delay lock loop 120 and clock tree 127 is back-timed by the delay in the output path. A particular edge of the read clock signal is chosen to drive the output read latch 124 to achieve a specified read latency for particular data read from array 170.

In order to ensure that the read data and read clock signal arrive at the read latch 124 in properly timed relationship, notwithstanding PVT or other timing variations, a read start signal is employed. The read start signal is issued by the command decoder 121 on line 118 when a READ command is decoded. The read start signal is applied to a slave delay circuit 132 which is slaved to the timing of delay lock loop 120. The output of slave delay 132 is applied to a clock tree model 133 which may be adjustable to replicate delays experienced by the read clock from clock tree 127. Thus, any timing variations imparted to the read clock signal on line 129 produced by DLL 120 are also imparted to the read start signal 174. As a consequence, the read start signal is subject to the same PVT or other timing variations which are experienced by the read clock signal on line 129 and is also back-timed for output path delays by the same amount as the read clock signal on line 129. The read start signal is output from the clock tree model 133 as a delayed start signal on line 174.

The delayed start signal on line 174 is applied to a down counter 148 which is loaded with a specified read data latency from a mode register 144. The specified latency is in the form of a number of clock cycles and may be fixed in the memory device 100 at the time of manufacture or may be a value programmed into mode register 144 through command decoding at decoder 121 by the memory controller 160 at initialization. In addition, if additional offsets are needed to account for delays in other memory device 100 operations, they may be subtracted from the latency value loaded into counter 148 from mode register 144. The offsets may originate from a separate offset circuit 145 or accounted for in the original latency data stored in mode register 144.

The down counter 148 is thus loaded with a number of read clock cycles which must occur following appearance of the delayed start signal on line 174 to attain a specified read latency for memory device 100. The start signal on line 174 enables the down counter 148 to count down from its initial value using the read clock signal on line 129. Once the counter 148 reaches a predetermined count value, e.g., zero, counter 148 enables the data pipe 104 so that data from array 170 reaches the read latch 124 properly timed relative to the read clock on line 129 to guarantee a specified read latency.

The invention illustrated ensures that no matter what PVT or other timing variations appear in the read clock they also appear in the delayed start signal on line 174 so that the data and read clock signal delivered to output latch 124 are properly synchronized to each other to ensure that the specified read latency is met.

As noted, FIG. 1 illustrates an offset with is provided to the down counter 148 from an offset circuit 145. The offset accounts for inherent delays in appearance of a read clock signal for particular read data. Thus there will be an inherent delay in the production of the read clock signal at read latch 124 following receipt of the READ command by the command (CMD) decoder 121. This delay is produced by the delay lock loop 120, clock tree 127 and others circuit delays in the read clock signal path. Thus, for example, it may take five external system clock cycles for a read clock signal to appear at the read latch 124 for addressed read data following receipt of a READ command. These delays, as measured in an integer number of external clock cycles, e.g., five external clock cycles, are supplied by offset circuit 145 to down counter 148 and are subtracted from the absolute read latency supplied by mode register 144. Thus, while the mode register 144 is initially set with the absolute read latency expected by the controller 160, for example, eight external clock XWCLK cycles, the offset circuit provides a subtracting value, e.g., five clock offsets, from this which is based on the inherent delays in generating the read clock signal for particular data to be read. The down counter circuit 148 stores the net result, e.g., three clock cycles for an absolute read latency of 8 clock cycles and a read clock signal delay of five clock cycles.

When the down counter 148 counts the three read clock signals following appearance of the start signal (a total of eight read clock cycles have then passed following a READ command), the eighth read clock cycle latches the data onto the output pads so that a total of eight read clock cycles corresponding to eight external system clock cycles have occurred. The counter 148 enables the start of data pipe 104 which remains operating for the duration of a read data burst.

Figure 2:
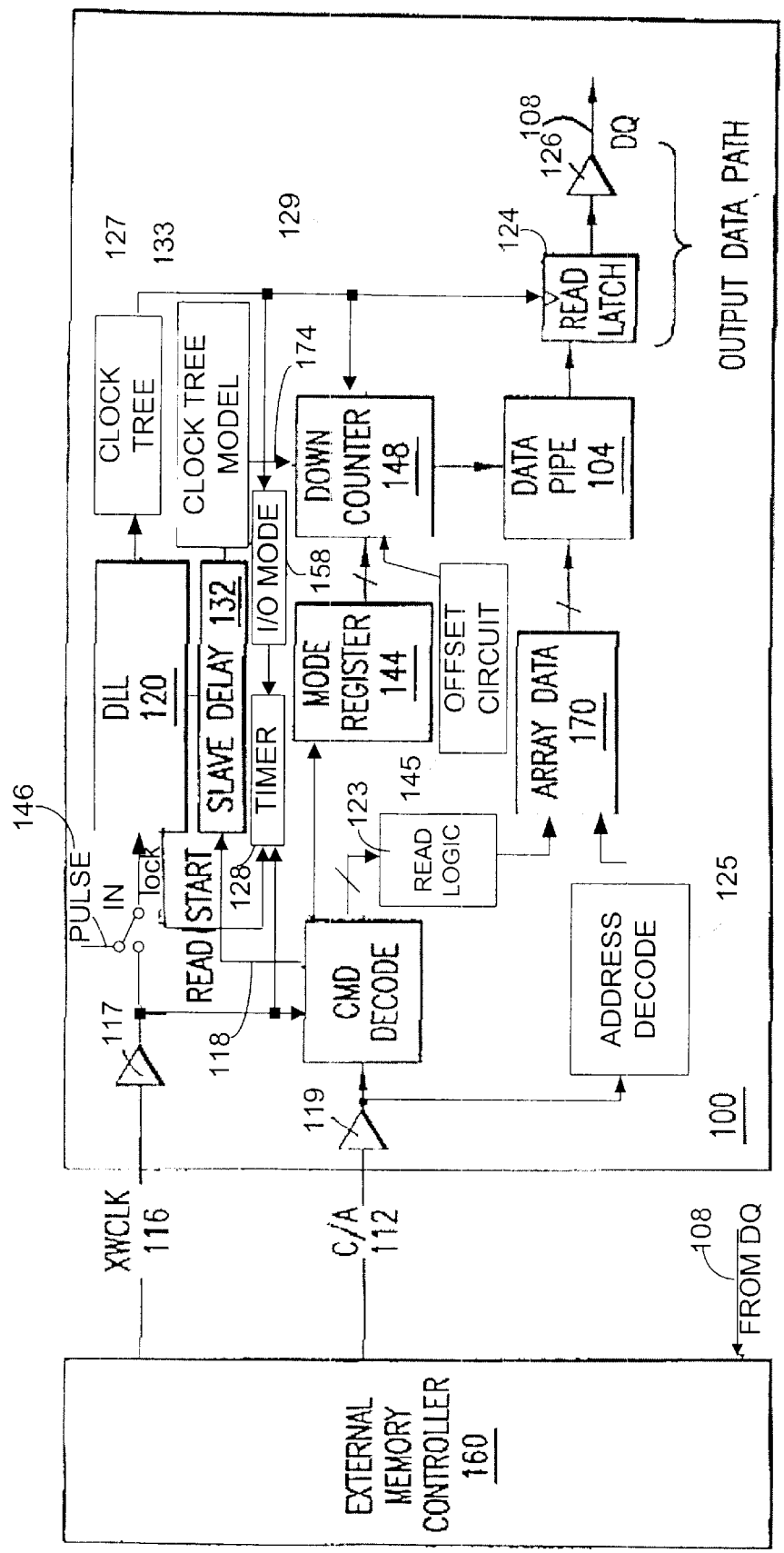
FIG. 2 is a block diagram of the first embodiment showing additional circuitry used during initialization.

The offset value provided by offset circuit 145 can be easily determined at system initialization by the system shown in FIG. 2. FIG. 2 is the same as FIG. 1, but additionally shows a timer 128, an I/O path model circuit 158 and a switch 146 for selectively applying an input pulse to DLL 120. During an initialization period, after the DLL 120 has locked, the timer 128 receives a DLL lock signal and sends a pulse signal via switch 146 through DLL 120 and begins counting the external clock signal XWCLK on line 116. Timer 128 stops counting the external clock signal when it receives an input from the I/O path model circuit 158 which is generated when the applied pulse signal appears on line 129. The I/O path model circuit 158 adjusts the timing of the arriving read clock signal to account for expected PVT variations and supplies the adjusted read clock signal to timer 128 which causes timer 128 to stop counting external clock signals. The count value held in timer is the offset in external clock signals representing the delay in generating the read clock signal once a READ command is issued. This offset value is stored in offset circuit 145 for use in offsetting the absolute read latency set in mode register 144 by controller 160.

As is apparent from the above, the invention as exemplified by the FIGS. 1, 2 embodiment ensures the correct read clock for the read data is at latch 124 at the same time as the read data from array 170 appears at the latch at the specified read latency even in the presence of PVT or other timing variations imparted to the read clock signal. A read start signal, which passes through a slave delay which applies the same delay and same timing adjustments to the start signal as those inherent in production of the read clock, is used to synchronize data passing from the array through the output path with the arrival time of the read clock.

Although the system has been described with an example in which the down counter 148 counts down to a value of zero and then fires the data pipe circuit 104, there may be inherent delays such as in starting the data pipe 104 or in decoding operating READ commands. Accordingly, in such situations the down counter 148 need not count all the way down to the value of zero before filling the data pipe 104, but may instead count down to a value which accounts for such delays. If, for example, and using the exemplary absolute read latency of eight external clock cycles, and with an offset of five clock cycles for generation of the read clock, the down counter, when enabled by the delayed start signal, begins counting from three to perhaps a count value of one if there is a one external clock cycle delay in READ command decoding or in the start of the output pipe 104.

Alternatively, any output path delay can be accounted for in the offset circuit 145 which provides an offset value which accounts for the data path delay.

Whatever value counter 148 counts down to, when that value is reached the down counter 148, or additional circuitry associated with counter 148, holds the data path open for the duration of a read data burst and thereafter is reset with a new count value from mode register 144 and offset circuit 145 for the next read operation.

Figure 3:
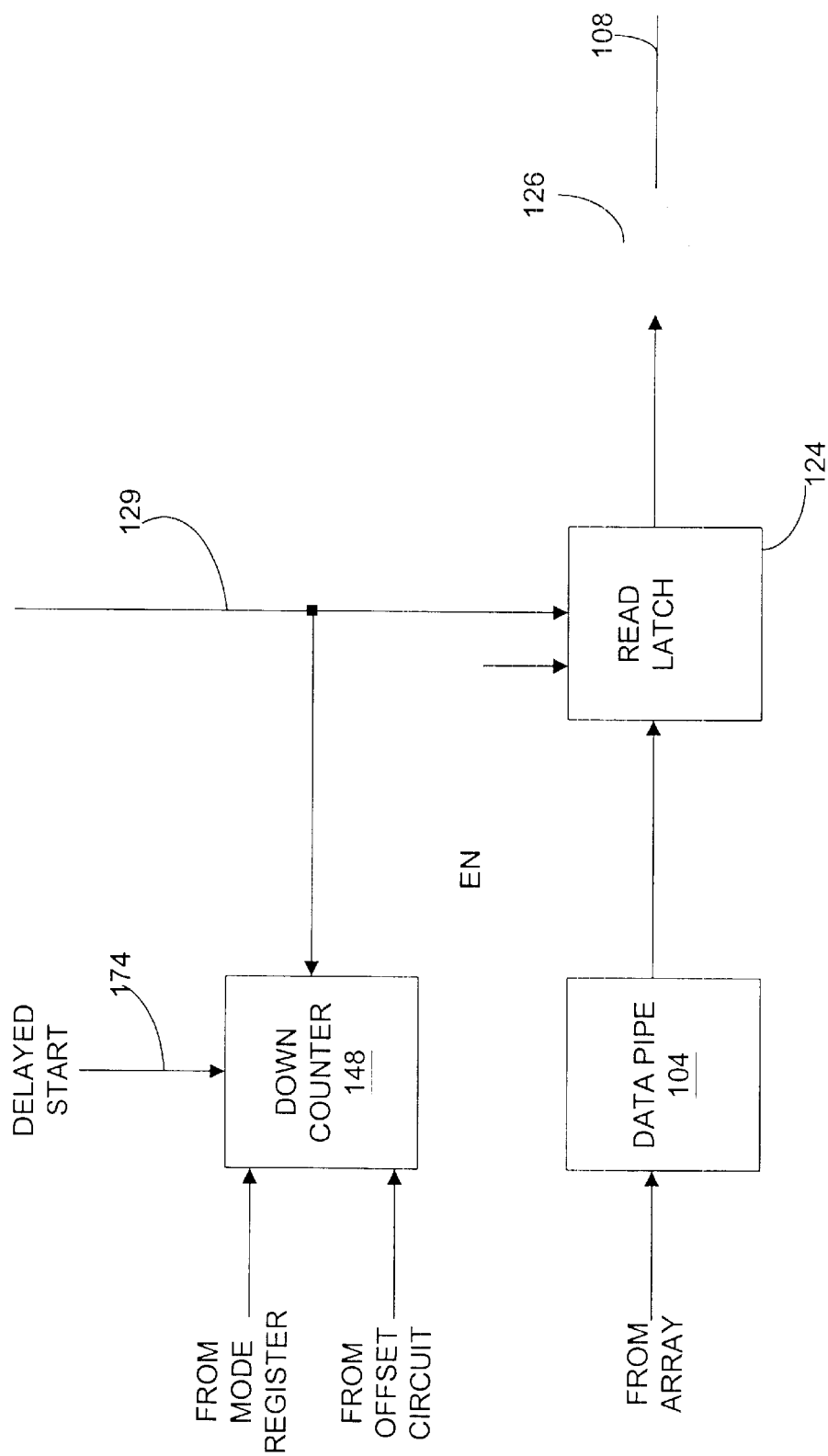
FIG. 3 is a block diagram showing a modification to a portion of the FIG. 1 circuit in a second embodiment of the invention.

FIG. 3 illustrates a modification of the FIG. 1 embodiment in which the down counter 148, rather than firing the data pipe 104, instead provides an enable signal EN to the read latch 124 to synchronize data output from the array with the read clock on line 129. Otherwise, the FIG. 3 embodiment is exactly the same as the FIG. 1 embodiment. In the FIG. 3 modification, the enable signal is provided when counter 148 counts down from its pre-loaded value to a zero value, or to another value if there are additional delays to be accommodated. The enable signal is also maintained by the down counter, or other logic associated therewith, for as many read clock cycles as are required for a data output burst. Thereafter, the counter 148 is reloaded and reset for a next read operation. Once again, the FIG. 3 embodiment, like the FIG. 1 embodiment, provides synchronization of the read data and read clock in the output path.

Figure 4:
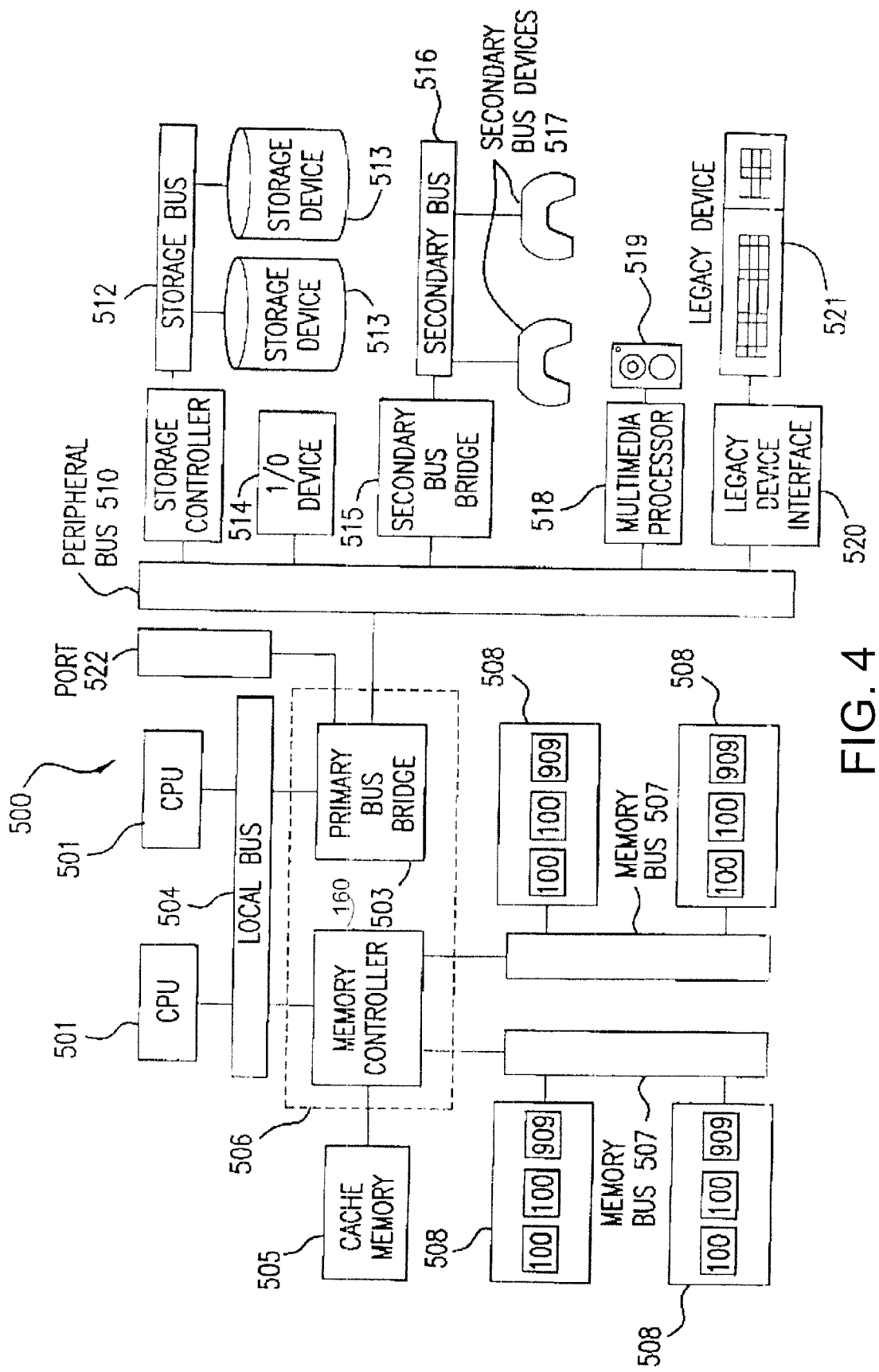
FIG. 4 is a block diagram depicting the memory device of FIGS. 1 and 2 implemented within a processor system.

FIG. 4 illustrates an exemplary processing system 500 which utilizes a DRAM memory device 100 in accordance with the embodiments of the present invention disclosed above in FIGS. 1–3. FIG. 4 depicts an exemplary personal computer or work station architecture. The processing system 500 includes one or more processors 501 coupled to a local bus 504. A memory controller 160 and a primary bus bridge 503 are also coupled to the local bus 504. The processing system 500 may include multiple memory controllers 160 and/or multiple primary bus bridges 503. The memory controller 160 and the primary bus bridge 503 may be integrated as a single device 506.

The memory controller 160 is also coupled to one or more memory buses 507. Each memory bus accepts memory components 508 which include at least one memory device 100. The memory components 508 may be a memory card or a memory module. Examples of memory modules include single inline memory modules (SIMMs) and dual inline memory modules (DIMMs). The memory components 508 may include one or more additional devices 509. For example, in a SIMM or DIMM, the additional device 509 might be a configuration memory, such as a serial presence detect (SPD) memory. The memory controller 502 may also be coupled to a cache memory 505. The cache memory 505 may be the only cache memory in the processing system. Alternatively, other devices, for example, processors 501 may also include cache memories, which may form a cache hierarchy with cache memory 505. If the processing system 500 include peripherals or controllers which are bus masters or which support direct memory access (DMA), the memory controller 160 may implement a cache coherency protocol. If the memory controller 160 is coupled to a plurality of memory buses 516, each memory bus 516 may be operated in parallel, or different address ranges may be mapped to different memory buses 507.

The primary bus bridge 503 is coupled to at least one peripheral bus 510. Various devices, such as peripherals or additional bus bridges may be coupled to the peripheral bus 510. These devices may include a storage controller 511, a miscellaneous I/O device 514, a secondary bus bridge 515, a multimedia processor 518, and a legacy device interface 520. The primary bus bridge 503 may also be coupled to one or more special purpose high speed ports 522. In a personal computer, for example, the special purpose port might be the Accelerated Graphics Port (AGP), used to couple a high performance video card to the processing system 500.

The storage controller 511 couples one or more storage devices 513, via a storage bus 512, to the peripheral bus 510. For example, the storage controller 511 may be a SCSI controller and storage devices 513 may be SCSI discs. The I/O device 514 may be any type of peripheral. For example, the I/O device 514 may be an local area network interface, such as an Ethernet card. The secondary bus bridge may be used to interface additional devices via another bus to the processing system. For example, the secondary bus bridge may be an universal serial port (USB) controller used to couple USB devices 517 via to the processing system 500. The multimedia processor 518 may be a sound card, a video capture card, or any other type of media interface, which may also be coupled to one additional devices such as speakers 519. The legacy device interface 520 is used to couple legacy devices, for example, older style keyboards and mice, to the processing system 500.

The processing system 500 illustrated in FIG. 4 is only an exemplary processing system with which the invention may be used. While FIG. 4 illustrates a processing architecture especially suitable for a general purpose computer, such as a personal computer or a workstation, it should be recognized that well known modifications can be made to configure the processing system 500 to become more suitable for use in a variety of applications. For example, many electronic devices which require processing may be implemented using a simpler architecture which relies on a CPU 501 coupled to memory components 508 and/or memory buffer devices 504. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. A method of operating a memory device, said method comprising:
   generating an internal read clock signal from an external clock signal using a first signal processing path, said first signal processing path causing variations in the timing of said generated read clock signal;
   generating a read start signal in response to a received read command;
   passing said read start signal through a second signal processing path which replicates the variations in the timing of said generated read clock signal caused by the first signal processing path and producing a delayed start signal; and
   using said delayed start signal to synchronize the output of read data by said read clock at a read latch.

2. A method of claim 1 wherein said delayed start signal synchronizes the output of read data by said read clock at said read latch with a predetermined read latency.

3. A method of claim 2 wherein said predetermined read latency is a predetermined number of external clock cycles following issuance of a read command by a memory controller.

4. A method of claim 3 further comprising using said delayed start signal to enable a counting of read clock cycles to a predetermined value; and
   causing read data from a memory array to pass through a data circuit to said read latch when said predetermined value is reached.

5. A method of claim 3 further comprising using said delayed start signal to enable a counting of read clock cycles to a predetermined value; and
   causing said read latch to be enabled when said predetermined value is reached.

6. A method of claim 4 further comprising:
   setting an initial value in a counter;
   enabling said counter with said delayed start signal to count read clock cycles from said initial value to said predetermined value.

7. A method of claim 5 further comprising:
   setting an initial value in a counter;
   enabling said counter with said delayed start signal to count read clock cycles from said initial value to said predetermined value.

8. A method of claim 6 wherein said initial value is determined from first data representing said predetermined read latency and second data representing the time taken for a read clock to exit from said first signal processing path following issuance of a read command by said memory controller.

9. A method of claim 7 wherein said initial value is determined from first data representing said predetermined read latency and second data representing the time taken for a read clock to exit from said first signal processing path following issuance of a read command by said memory controller.

10. A method of claim 8 wherein said first and second data are stored in said memory device.

11. A method of claim 9 wherein said first and second data are stored in said memory device.

12. A method of claim 10 wherein said first data is stored in a mode register of said memory device.

13. A method of claim 11 wherein said first data is stored in a mode register of said memory device.

14. A method of claim 12 wherein said second data is stored in an offset circuit of said memory device.

15. A method of claim 13 wherein said second data is stored in an offset circuit of said memory device.

16. A method of claim 12 wherein said first data is supplied to said mode register by said memory controller.

17. A method of claim 13 wherein said first data is supplied to said mode register by said memory controller.

18. A method of claim 14 further comprising determining the time taken for a read clock signal to pass through said first processing path after a read command is issued and storing said determined time as clock cycles of said external clock in said offset circuit.

19. A method of claim 15 further comprising determining the time taken for a read clock signal to pass through said first processing path after a read command is issued and storing said determined time as clock cycles of said external clock in said offset circuit.

20. A method of claim 1 further comprising slaving said second signal processing path to said first signal processing path to produce said replication.

21. A method of claim 20 wherein said first signal processing path includes a first delay lock loop and said second processing path includes a delay circuit slaved to said first delay lock loop.

22. A method of claim 1 wherein said timing variations are at least one of fabrication process, voltage and temperature induced timing variations.

23. A method of operating a memory device, comprising:
    using an external clock signal as an input to a first delay lock loop to produce a read clock signal;
    passing a signal generated in response to receipt of a read command through a delay circuit slaved to said first delay lock loop to produce a delayed signal; and
    using said delayed signal and read clock signal to output read data from a memory array of said memory device.

24. A method of claim 23 wherein said act of using comprises:
    using said delayed signal to enable the counting of read clock cycles to a predetermined count value;
    enabling a data circuit which supplies array data to an output latch when said counter reaches said predetermined value; and
    latching said supplied data with said read clock signal.

25. A method of claim 23 wherein said act of using comprises:
    using said delayed signal to enable the counting of read clock cycles to a predetermined count value;
    enabling an output latch when said counter reaches said predetermined value; and
    latching said supplied data with said read clock signal.

26. A method of claim 24 wherein said counting is such that said output latch supplies read data to an output bus with a predetermined read latency.

27. A method of claim 25 wherein said counting is such that said output latch supplies read data to an output bus with a predetermined read latency.

28. A method of claim 26 wherein said counting to said predetermined value begins from a preset value which is at least in part determined in accordance with said predetermined read latency.

29. A method of claim 27 wherein said counting to said predetermined value begins from a preset value which is at least in part determined in accordance with said predetermined read latency.

30. A method of claim 28 wherein said preset value is based on said predetermined read latency which is offset by at least the time taken for a read clock signal to propagate through a signal processing path, which includes said delay lock loop, following a read command.

31. A method of claim 29 wherein said preset value is based on said predetermined read latency which is offset by at least the time taken for a read clock signal to propagate through a signal processing path, which includes said delay lock loop, following a read command.

32. A method of claim 30 wherein said predetermined read latency is further offset by an additional delay inherent in operation of said memory device.

33. A method of claim 31 wherein said predetermined read latency is further offset by an additional delay inherent in operation of said memory device.

34. A method of claim 32 wherein said additional delay is caused at least in part by the decoding of a send command.

35. A method of claim 33 wherein said additional delay is caused at least in part by the decoding of a send command.

36. A method of claim 32 wherein said additional delay is caused at least in part by the start up of a data path.

37. A method of claim 33 wherein said additional delay is caused at least in part by the start up of a data path.

38. A method of claim 23 wherein said delay lock loop and delay circuit are subject to the same induced signal timing variations.

39. A method of claim 38 wherein said induced signal timing variations are induced by at least one of fabrication process, voltage and temperature variations.

40. A memory device comprising:
   a first signal processing path for producing an internal read clock signal from an external clock signal, said first signal processing path imparting timing variations on said read clock signal;
   a second signal processing path for producing a delayed start signal from a received read command, said second signal processing path imparting said timing variations to said delayed start signal; and
   a data flow control circuit for outputting read data in response to said delayed start signal and read clock signal.

41. A memory device of claim 40 wherein said data flow control circuit comprises:
   a read latch;
   a circuit for supplying read data from a memory array to said read latch; and
   a circuit for synchronizing the output of read data through said latch with said read clock a predetermined number of read clock cycles following generation of said delayed start signal.

42. A memory device of claim 41 wherein said enabling circuit comprises:
   a counter for counting a predetermined number of read clock cycles, said counter being enabled by said delayed start signal;
   said supply circuit being enabled when said predetermined number of read clock cycles is counted.

43. A memory device of claim 41 wherein said enabling circuit comprises:
   a counter for counting a predetermined number of read clock cycles, said counter being enabled by said delayed start signal;
   said read latch being enabled when said predetermined number of read clock cycles is counted.

44. A memory device as in claim 42 wherein said predetermined number of read clock cycle corresponds to the time required to supply read data to output pads of said memory device with a predetermined read latency.

45. A memory device as in claim 43 wherein said predetermined number of read clock cycle corresponds to the time required to supply read data to output pads of said memory device with a predetermined read latency.

46. A memory device of claim 42 further comprising circuitry for pre-loading said counter with a specific count value, said counter counting said predetermined number of read clock cycles from said specific count value.

47. A memory device of claim 43 further comprising circuitry for pre-loading said counter with a specific count value, said counter counting said predetermined number of read clock cycles from said specific count value.

48. A memory device as in claim 46 wherein said specific count value is related to the number of read clock cycles required to produce a specific read latency for said memory device.

49. A memory device as in claim 47 wherein said specific count value is related to the number of read clock cycles required to produce a specific read latency for said memory device.

50. A memory device as in claim 48 wherein said specific count value is based on said specified read latency as offset by the time, required for a read clock to exit from said first signal processing path after a memory read command is issued by a memory controller.

51. A memory device as in claim 49 wherein said specific count value is based on said specified read latency as offset by the time, required for a read clock to exit from said first signal processing path after a memory read command is issued by a memory controller.

52. A memory device as in claim 50 wherein said specified count value is based on said specified read latency as further offset by an additional delay within said memory device.

53. A memory device as in claim 51 wherein said specified count value is based on said specified read latency as further offset by an additional delay within said memory device.

54. A memory device as in claim 52 wherein said additional delay is caused at least in part by the decoding of a read command.

55. A memory device as in claim 53 wherein said additional delay is caused at least in part by the decoding of a read command.

56. A memory device as in claim 52 wherein said additional delay is caused at least in part by a start up time of said circuit for supplying read data to said output latch.

57. A memory device as in claim 53 wherein said additional delay is caused at least in part by a start up time of said circuit for supplying read data to said output latch.

58. A memory device of claim 48 wherein said pre-loading circuitry comprises a mode register for supplying a first count value related to a specified read latency to said counter.

59. A memory device of claim 49 wherein said pre-loading circuitry comprises a mode register for supplying a first count value related to a specified read latency to said counter.

60. A memory device of claim 58 wherein said first count value is a specified read latency, and said pre-loading circuit further comprises an offset circuit for supplying a second count value to said counter relating to the time taken for a read clock to exit said first signal processing path after a read command is issued, said counter being pre-loaded with the difference between said first and second count values.

61. A memory device of claim 59 wherein said first count value is a specified read latency, and said pre-loading circuit further comprises an offset circuit for supplying a second count value to said counter relating to the time taken for a read clock to exit said first signal processing path after a read command is issued, said counter being pre-loaded with the difference between said first and second count values.

62. A memory device of claim 60 wherein said counter is pre-loaded with said difference as further offset by a count value relating to the time it takes read data to pass through said supply circuit and read latch to output pads of said memory device.

63. A memory device of claim 61 wherein said counter is pre-loaded with said difference as further offset by a count value relating to the time it takes read data to pass through said supply circuit and read latch to output pads of said memory device.

64. A memory device of claim 40 wherein said first processing path comprises a delay lock loop.

65. A memory device of claim 64 wherein said second processing path includes a delay circuit slaved to said delay lock loop.

66. A memory device comprising:
a delay lock loop for processing a read clock signal from an external clock signal;
a delay circuit synchronized with said delay lock loop for producing a delayed start signal from a start signal generated in response to receipt of a read command;
a read data latch;
a data pass circuit for passing data from a memory array to said read data latch; and
an enable circuit responsive to said delayed start signal for enabling data from said data pass circuit to be read out by said read clock signal after a predetermined number of cycles of said read clock signal are counted.

67. A memory device of claim 66 wherein said delay circuit is slaved to said delay lock loop.

68. A memory device as in claim 66 wherein said data pass circuit is a data pipeline circuit.

69. A memory device of claim 68 wherein said data pipeline circuit includes a parallel to serial converter.

70. A memory device of claim 66 wherein said enable circuit synchronizes the read out of read data at said read latch with the timing of said read clock signal.

71. A memory device of claim 70 wherein said enable circuit and read clock signal provide data at an output of said memory device with a specified read latency.

72. A memory circuit of claim 66 wherein said enable circuit comprises a counter pre-loaded with a first value for counting read clock signal cycles from said first value to a second value and for enabling the read out of said data by said read clock signal when said second value is reached.

73. A memory device as in claim 72 wherein said counter is a down counter.

74. A processor system comprising
a processor; and
a memory device for exchanging data with said processor, said memory device comprising:
a first signal processing path for producing an internal read clock signal from an external clock signal said first signal processing path imparting timing variations on said read clock signal;
a second signal processing path for producing a delayed start signal from a received read command, said second signal processing path imparting said timing variations to said delayed start signal; and
a data flow control circuit for outputting read data in response to said delayed start signal and read clock signal.

75. A processor system of claim 74, wherein said data flow control circuit comprises:
a read latch;
a circuit for supplying read data from a memory array to said read latch; and
a circuit for synchronizing the output of read data through said latch a predetermined number of read clock cycles following generation of said delayed start signal.

76. A processor system of claim 75 wherein said enabling circuit comprises:
a counter for counting a predetermined number of read clock cycles, said counter being enabled by said delayed start signal;
said supply circuit being enabled when said predetermined number of read clock cycles is counted.

77. A processor system of claim 75 wherein said enabling circuit comprises:
a counter for counting a predetermined number of read clock cycles, said counter being enabled by said delayed start signal; and
said read latch being enabled when said predetermined number of clock cycles is counted.

78. A processor system of claim 76 wherein said predetermined number of read clock cycles corresponds to the time required to supply read data to output pads of said memory device with a predetermined read latency.

79. A processor system of claim 77 wherein said predetermined number of read clock cycles corresponds to the time required to supply read data to output pads of said memory device with a predetermined read latency.

80. A processor system of claim 76 further comprising circuitry for pre-loading said counter with a specific count value, said counter counting said predetermined number of read clock cycles from said specific count value.

81. A processor system of claim 77 further comprising circuitry for pre-loading said counter with a specific count value, said counter counting said predetermined number of read clock cycles from said specific count value.

82. A processor system of claim 80 wherein said specific count value is related to the number of read clock cycles required to produce a specific read latency for said memory device.

83. A processor system of claim 81 wherein said specific count value is related to the number of read clock cycles required to produce a specific read latency for said memory device.

84. A processor system of claim 82 wherein said specific count value is based on said specified read latency as offset by the time required for a read clock to exit from said first signal processing path after a memory read command is issued by a memory controller.

85. A processor system of claim 83 wherein said specific count value is based on said specified read latency as offset by the time required for a read clock to exit from said first signal processing path after a memory read command is issued by a memory controller.

86. A processor system of claim 84 wherein said specified count value is based on said specified read latency as further offset by an additional amount representing a start up delay of said circuit for supplying read data.

87. A processor system of claim 85 wherein said specified count value is based on said specified read latency as further offset by an additional amount representing a start up delay of said circuit for supplying read data.

88. A processor system of claim 84 wherein said specified count value is based on said specified read latency as further offset by a delay in decoding a read command.

89. A processor system of claim 85 wherein said specified count value is based on said specified read latency as further offset by a delay in decoding a read command.

90. A processor system of claim 80 wherein said pre-loading circuitry comprises a mode register for supplying a first count value related to a specified read latency to said counter.

91. A processor system of claim 81 wherein said pre-loading circuitry comprises a mode register for supplying a first count value related to a specified read latency to said counter.

92. A processor system of claim 90 wherein said first count value is a specified read latency, and said pre-loading circuit further comprises an offset circuit for supplying a second count value to said counter relating to the time taken for a read clock to exit said first signal processing path after a read command is issued, said counter being pre-loaded with the difference between said first and second count values.

93. A processor system of claim 91 wherein said first count value is a specified read latency, and said pre-loading circuit further comprises an offset circuit for supplying a second count value to said counter relating to the time taken for a read clock to exit said first signal processing path after a read command is issued, said counter being pre-loaded with the difference between said first and second count values.

94. A processor system of claim 92 wherein said counter is pre-loaded with said difference as further offset by a count value relating to the time it takes read data to pass through said supply circuit and read latch to output pads of said memory device.

95. A processor system of claim 93 wherein said counter is pre-loaded with said difference as further offset by a count value relating to the time it takes read data to pass through said supply circuit and read latch to output pads of said memory device.

96. A processor system of claim 74 wherein said first processing path comprises a delay lock loop.

97. A processor system of claim 94 wherein said second processing path includes a delay circuit slaved to said delay lock loop.

98. A processor system comprising:
a processor; and
a memory device for exchanging data with said processor, said memory device comprising:
a delay lock loop for processing a read clock signal from an external clock signal;
a delay circuit synchronized with said delay lock loop for producing a delayed start signal from a start signal generated in response to receipt of a read command;
a read data latch;
a data pass circuit for passing data from a memory array to said read data latch; and
an enable circuit responsive to said delayed start signal for enabling data from said data pass circuit to be read out by said read clock signal after a predetermined number of cycles of said read clock signal are counted.

99. A processor system of claim 98 wherein said delay circuit is slaved to said delay lock loop.

100. A processor system of claim 98 wherein said data pass circuit is a data pipeline circuit.

101. A processor system of claim 100 wherein said data pipeline circuit includes a parallel to serial converter.

102. A processor system of claim 98 wherein said enable circuit synchronizes application of read data to said read latch with the timing of said read clock signal.

103. A processor system of claim 102 wherein said enable circuit and read clock signal provide data at an output of said memory device with a specified read latency.

104. A processor system of claim 98 wherein said enable circuit comprises a counter pre-loaded with a first value for counting read clock signal cycles from said first value to a second value and for enabling a read out of read data with said read clock signal when said second value is reached.

105. A processor system of claim 104 wherein said counter is a down counter.

* * * * *

UNITED STATES PATENT AND TRADEMARK OFFICE
CERTIFICATE OF CORRECTION

PATENT NO. : 6,687,185 B1  Page 1 of 1
DATED : February 3, 2004
INVENTOR(S) : Brent Keeth et al.

It is certified that error appears in the above-identified patent and that said Letters Patent is hereby corrected as shown below:

Column 1,
Line 26, reads "tie" should read -- the --.

Column 6,
Lines 45 and 49, reads "an" should read -- a --.
Line 53, reads "one additional" should read -- additional --.

Signed and Sealed this

Fifteenth Day of June, 2004

JON W. DUDAS
*Acting Director of the United States Patent and Trademark Office*